United States Patent
Yokou et al.

(10) Patent No.: US 8,665,008 B2
(45) Date of Patent: Mar. 4, 2014

(54) SEMICONDUCTOR DEVICE THAT CAN CANCEL NOISE IN BIAS LINE TO WHICH BIAS CURRENT FLOWS

(75) Inventors: Hideyuki Yokou, Tokyo (JP); Isao Nakamura, Tokyo (JP); Manabu Ishimatsu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/398,711

(22) Filed: Feb. 16, 2012

(65) Prior Publication Data
US 2012/0212286 A1 Aug. 23, 2012

(30) Foreign Application Priority Data
Feb. 22, 2011 (JP) ................................. 2011-036041

(51) Int. Cl.
*G05F 1/10* (2006.01)
(52) U.S. Cl.
USPC ............................. 327/543; 327/538; 327/546
(58) Field of Classification Search
USPC ......... 327/537, 538, 542, 543, 545, 546, 589, 327/592, 594, 170, 172, 175, 231, 237, 243, 327/244, 250, 251, 261, 262, 264, 265, 276, 327/277, 278, 279, 281, 284, 286, 288, 292
See application file for complete search history.

(56) References Cited

U.S. PATENT DOCUMENTS

| | | | | |
|---|---|---|---|---|
| 5,489,870 | A * | 2/1996 | Arakawa | 327/536 |
| 7,952,408 | B2 * | 5/2011 | Eisenstadt et al. | 327/231 |
| 2001/0040473 | A1 * | 11/2001 | Yoshikawa | 327/276 |
| 2009/0058481 | A1 * | 3/2009 | Kim et al. | 327/175 |

FOREIGN PATENT DOCUMENTS

JP 2009-065633 A 3/2009

* cited by examiner

*Primary Examiner* — Lincoln Donovan
*Assistant Examiner* — Jung H Kim
(74) *Attorney, Agent, or Firm* — McGinn IP Law Group, PLLC

(57) ABSTRACT

Disclosed herein is a device that includes a bias line to which a bias current flows, a switch circuit controlling an amount of the bias current based on a control signal, a control line to which the control signal is supplied, and a cancellation circuit substantially cancelling a potential fluctuation of the bias line caused by changing the control signal, the potential fluctuation propagating via a parasitic capacitance between the control line and the bias line.

20 Claims, 6 Drawing Sheets

SEMICONDUCTOR DEVICE THAT CAN CANCEL NOISE IN BIAS LINE TO WHICH BIAS CURRENT FLOWS

BACKGROUND OF THE INVENTION

1. Field of the Invention

The present invention relates to a semiconductor device, and more particularly relates to a semiconductor device capable of switching a bias current flowing along a bias line.

2. Description of Related Art

There are cases that a semiconductor device switches the amount of a bias current flowing along a bias line. As an example, a type of duty-cycle control circuit that controls a duty cycle of a clock signal has a function to change a duty cycle based on a bias current (see Japanese Patent Application Laid-open No. 2009-65633). In such a type of duty-cycle control circuit, a feedback control of changing the amount of the bias current that flows along the bias line in response to the present duty cycle of the clock signal is conducted for the purpose of stabilizing the duty cycle of the clock signal to a desired value (typically, 50%).

However, changing a bias current that flows along a bias line can cause generation of noise on the bias line due to on and off of a switch. In this case, noise is generated whenever the bias current is changed. If such noise is generated in the above-mentioned duty-cycle control circuit which changes a duty cycle based on a bias current, there is a risk that the duty-cycle control circuit cannot stabilize the duty cycle of the clock signal to a desired value.

SUMMARY

In one embodiment, there is provided a semiconductor device that includes: a bias line to which a bias current flows; a switch circuit controlling an amount of the bias current based on a control signal; a control line to which the control signal is supplied; and a cancellation circuit substantially cancelling a potential fluctuation of the bias line caused by changing the control signal, the potential fluctuation propagating via a parasitic capacitance between the control line and the bias line.

In another embodiment, there is provided a semiconductor device that includes: a bias line to which a bias current flows; a switch circuit including a plurality of MOS transistors each having a gate electrode and a drain, each of the gate electrodes having a different width from each other, and the drains being commonly coupled to the bias line; a control circuit supplying each of control signals to the gate electrode of an associated one of the MOS transistors; and a plurality of balance capacities each having a different capacitance from each other, and each having one end being commonly coupled to the bias line and the other end to which an inversion signal of an associated one of the control signals is supplied.

DETAILED DESCRIPTION OF THE EMBODIMENTS

Preferred embodiments of the present invention will be explained below in detail with reference to the accompanying drawings.

Figure 1:
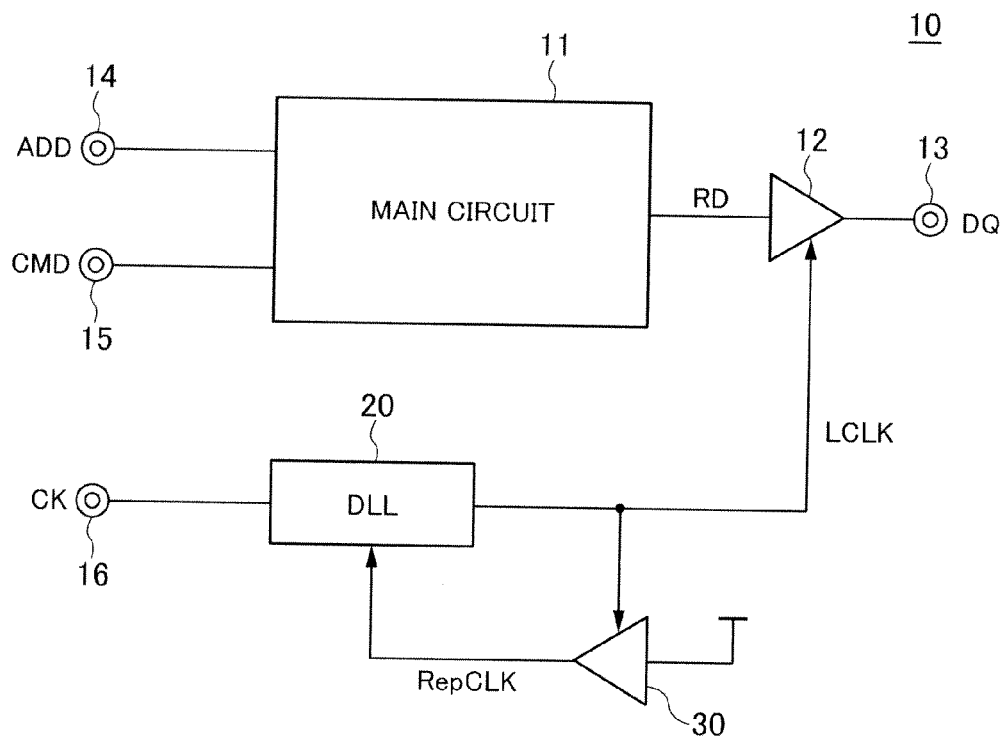
FIG. 1 is a block diagram showing an overall configuration of a semiconductor device 10 according to an embodiment of the present invention.

Referring now to FIG. 1, the semiconductor device 10 according to the present embodiment includes a main circuit 11 and an output buffer 12 that drives a data output terminal 13 based on internal data RD output from the main circuit 11. Although the type of the semiconductor device 10 is not limited to any specific one, the semiconductor device 10 is a DRAM (Dynamic Random Access Memory), for example. When the semiconductor device 10 is a DRAM, the main circuit 11 includes a memory cell array and an access circuit (such as a decoder) for accessing the memory cell array. In this case, an address signal ADD and a command signal CMD are input to the main circuit 11 via an address terminal 14 and a command terminal 15, respectively. When the command signal CMD indicates a read command, data is read from a memory cell specified by the address signal ADD and output as read data DQ from a data output terminal 13. However, the present invention is not limited to DRAMs, but is also applicable to semiconductor memory devices other than DRAMs or semiconductor devices other than semiconductor memory devices.

The output buffer 12 operates synchronously with an internal clock signal LCLK. The internal clock signal LCLK is generated by that a DLL circuit 20 delays an external clock signal CK supplied from outside via a clock terminal 16. The internal clock signal LCLK generated by the DLL circuit 20 is supplied to a replica buffer 30 substantially the same in the circuit configuration as the output buffer 12. An output from the replica buffer 30, that is, a replica clock RepCLK is fed back to the DLL circuit 20. Because the replica buffer 30 is substantially the same in the circuit configuration as the output buffer 12, the phase of the replica clock RepCLK output from the replica buffer 30 accurately matches the phase of the read data DQ output from the output buffer 12. The DLL circuit 20 determines the delay amount in the external clock signal CK upon reception of the replica clock RepCLK, and controls the duty cycle of the internal clock signal LCLK, which is to be output from the DLL circuit 20, to 50%.

Figure 2:
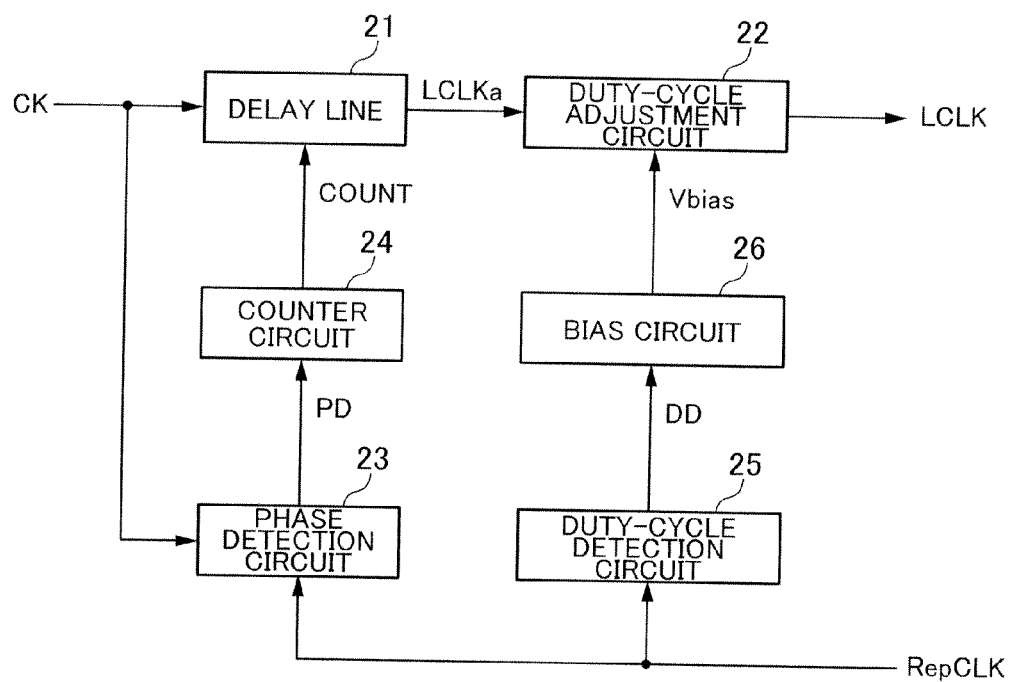
FIG. 2 is a block diagram showing an example of a configuration of the DLL circuit 20 shown in FIG. 1.

Turning to FIG. 2, the DLL circuit 20 includes a delay line 21 that delays the external clock signal CK and a duty-cycle adjustment circuit 22 that adjusts the duty cycle of an internal clock signal LCLKa output from the delay line 21. An output from the duty-cycle adjustment circuit 22 is used as the internal clock signal LCLK. The DLL circuit 20 also includes a phase detection circuit 23, a counter circuit 24, a duty-cycle detection circuit 25, and a bias circuit 26.

The phase detection circuit 23 compares the phase of the external clock signal CK with the phase of the replica clock RepCLK, and generates a phase determination signal PD based on the result of comparison. For example, the phase detection circuit 23 sets the phase determination signal PD to a low level when the phase of the replica clock RepCLK lags behind the phase of the external clock signal CK, and sets it to a high level when the phase of the replica clock RepCLK leads over the phase of the external clock signal CK. The phase detection circuit 23 supplies the phase determination signal PD to the counter circuit 24. The counter circuit 24 counts up or counts down a count value COUNT based on the phase determination signal PD.

The counter circuit 24 supplies the count value COUNT to the delay line 21, and the delay line 21 changes the delay amount in the external clock signal CK based on the count value COUNT. Accordingly, for example, when the phase determination signal PD is at a low level, the counter circuit 24 counts down the count value COUNT, and the delay line 21 reduces the delay amount in the external clock signal CK. As a result, the phase of the replica clock RepCLK is advanced until matching the phase of the external clock signal CK. Conversely, when the phase determination signal PD is a high level, the counter circuit 24 counts up the count value COUNT, and the delay line 21 increases the delay amount in the external clock signal CK. Accordingly, the phase of the replica clock RepCLK is delayed until matching the phase of the external clock signal CK.

Meanwhile, the duty-cycle detection circuit 25 detects the duty cycle of the replica clock RepCLK, and generates a duty-cycle control signal DD based on the result of detection. In the present embodiment, although not limited thereto, the duty-cycle control signal DD is a three-bit binary signal. The duty-cycle detection circuit 25 supplies the duty-cycle control signal DO to the bias circuit 26.

The bias circuit 26 generates a bias voltage Vbias based on the duty-cycle control signal DD. Since the duty-cycle control signal DD is a three-bit binary signal as described above in the present embodiment, the bias circuit 26 changes the level of the bias signal Vbias in eight stages ($=2^3$). The bias circuit 26 is described later in detail. The bias voltage Vbias generated by the bias circuit 26 is supplied to the duty-cycle adjustment circuit 22.

Figure 3:
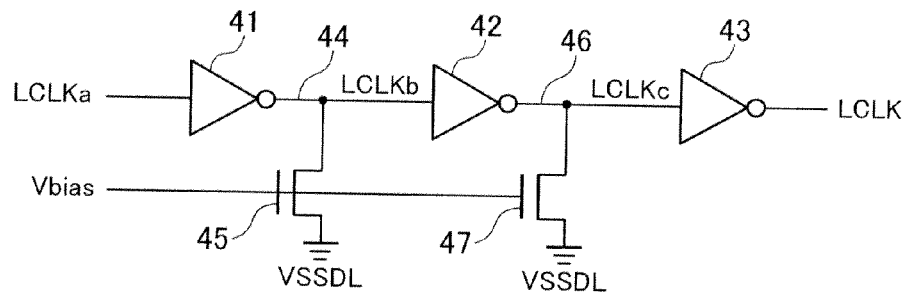
FIG. 3 is a circuit diagram showing an example of the duty-cycle adjustment circuit 22 shown in FIG. 2.

Turning to FIG. 3, the duty-cycle adjustment circuit 22 includes three stages of inverters 41 to 43 connected in series. The internal clock signal LCLKa is supplied to the initial stage inverter 41, and the last stage inverter 43 outputs the internal clock signal LCLK. A bias transistor 45 is connected to a clock transmission line 44 that connects the inverter 41 to the inverter 42, and a bias transistor 47 is connected to a clock transmission line 46 that connects the inverter 42 to the inverter 43. The bias voltage Vbias is supplied to gates of both the bias transistors 45 and 47, and a ground potential VSSDL is supplied to sources thereof. For this reason, transmission characteristics of the clock transmission lines 44 and 46 change according to the bias voltage Vbias.

Figure 4:
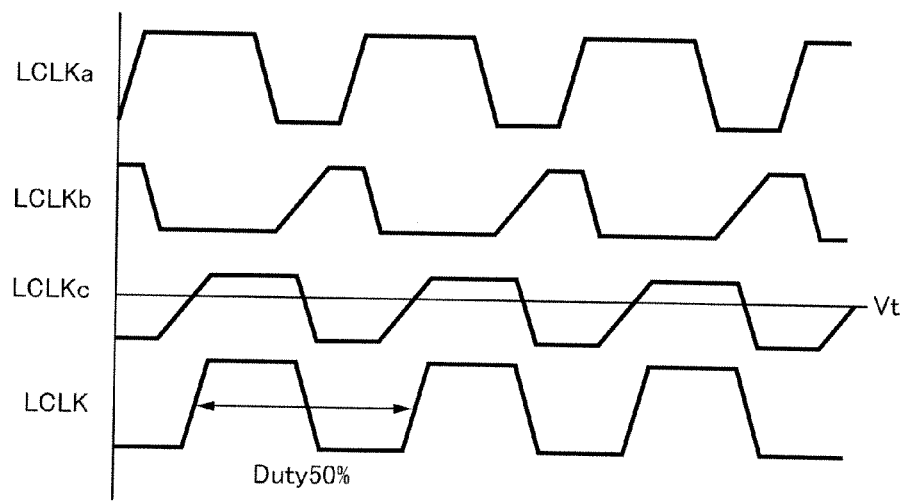
FIG. 4 is a waveform diagram for explaining an operation of the duty-cycle adjustment circuit 22 shown in FIG. 3.

FIG. 4 shows a state where the duty cycle of the internal clock signal LCLKa exceeds 50%. In this case, the level of the bias voltage Vbias is raised. That is, the amount of electric charge extracted by the bias transistors 45 and 47 is increased. As a result, as shown in FIG. 4, the times for rising of the clock signals LCLKb and LCLKc transmitting on the clock transmission lines 44 and 46, respectively, lengthen. The internal clock signal LCLK output from the last stage inverter 43 inverts whenever the clock signal LCLKc on the clock transmission line 46 exceeds a threshold value Vt of the inverter 43. Therefore, the duty cycle of the finally obtained internal clock signal LCLK becomes lower than that of the internal clock signal LCLKa. In this way, the duty cycle of the internal clock signal LCLK is controlled to be 50%.

Figure 5:
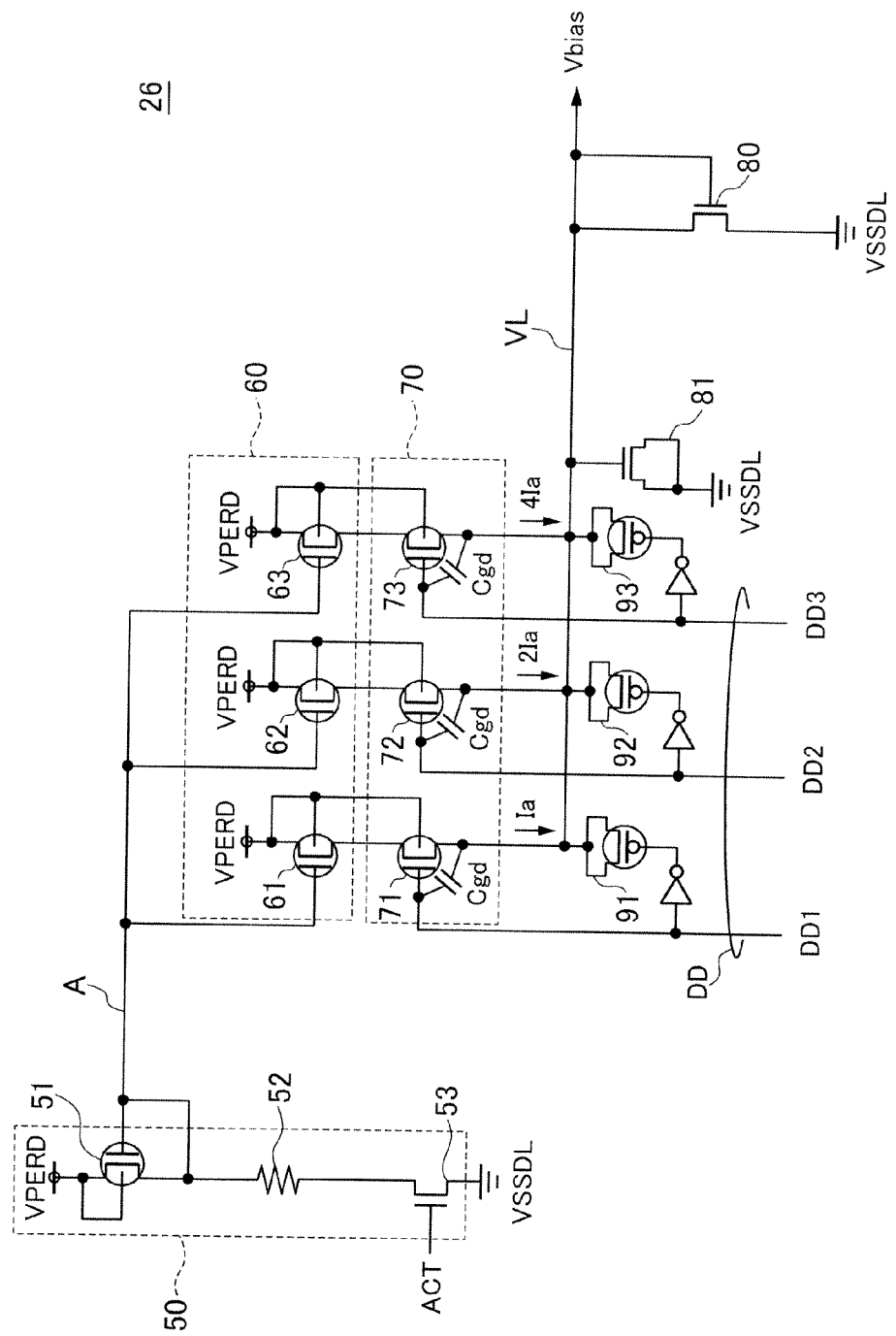
FIG. 5 is a circuit diagram showing an example of the bias circuit 26 shown in FIG. 2.

Turning to FIG. 5, the bias circuit 26 includes a bias source 50 that constitutes an input side of a current mirror circuit, a current source 60 that constitutes an output side of the current mirror circuit, and a switch 70 that is connected between the current source 60 and a bias line VL.

The bias source 50 includes a P-channel MOS transistor 51, a resistor 52, and an N-channel MOS transistor 53 that are connected in series between a power supply potential VPERD and the ground potential VSSDL. A gate and a drain of the transistor 51 are short-circuited to each other, thereby constituting an input transistor of the current mirror circuit. The transistor 53 is provided to activate the bias source 50, and an activation signal ACT is input to a gate of the transistor 53. Therefore, a constant current flows to the bias source 50 in response that the level of the activation signal ACT becomes high, and the potential of a node A becomes equal to a predetermined potential.

The current source 60 includes three P-channel MOS transistors 61 to 63. Sources of the P-channel MOS transistors 61 to 63 are connected to the power supply potential VPERD and gates thereof are connected to the node A. Therefore, the transistors 61 to 63 constitute an output transistor of the current mirror circuit. The transistors 61 to 63 have a different channel width to each other. In the present embodiment, assuming that the channel width of the transistor 61 is Wa, the channel widths of the transistors 62 and 63 are set to 2 Wa and 4 Wa, respectively. Therefore, assuming that a drain current of the transistor 61 is Ia, drain currents of the transistors 62 and 63 are set to 2 Ia and 4 Ia, respectively.

The switch 70 includes three P-channel MOS transistors 71 to 73 connected between the current source 60 and the bias line VL. A source of each of the transistors 71 to 73 is connected to a drain of the corresponding one of the transistors 61 to 63. Three bits DD1 to DD3 that constitute the duty cycle signal DD are supplied to gates of the transistors 71 to 73, respectively. The transistors 71 to 73 are thereby controlled to be turned on or off independently based on the respective bits DD1 to DD3 of the duty-cycle control signal DD. In the present embodiment, the transistors 71 to 73 have a different channel width to each other, similarly to the transistors 61 to 63, so as to reduce ON resistance. Assuming that the channel width of the transistor 71 is Wb, the channel widths of the transistors 72 and 73 are set to 2 Wb and 4 Wb, respectively. The channel width Wb can be set equal to the channel width Wa.

With this configuration, the amount of the bias current flowing from the current source 60 to the bias line VL is controlled on eight stages based on the duty cycle signal DD. As shown in FIG. 5, a current-to-voltage conversion circuit 80 that is constituted by a diode-corrected N-channel MOS transistor is connected to the bias line VL. Accordingly, the potential of the bias line VL becomes a level according to the amount of the bias current flowing into the bias line VL, that is, the value of the duty cycle signal DD.

Furthermore, in the present embodiment, balance capacities 91 to 93 are connected to the bias line VL. The balance capacities 91 to 93 are constituted by P-channel MOS transistors each having a source short-circuited to a drain. The sources and drains of the transistors are connected to the bias line VL, and inversion signals of the three bits DD1 to DD3 constituting the duty-cycle control signal DD are supplied to gates of the transistors, respectively. In the present embodiment, the transistors constituting the respective balance capacities 91 to 93 have also a different channel width to each other. Assuming that the channel width of the transistor that constitutes the balance capacity 91 is Wc, the channel widths of the transistors that constitute the balance capacities 92 and 93 are set to 2 Wc and 4 Wc, respectively. The channel width Wc is preferably half the channel width Wb.

The balance capacities 91 to 93 act as cancellers of noise which is generated in the bias line VL when the transistors 71 to 73 constituting the switch 70 change from an ON-state to an OFF-state or from an OFF-state to an ON-state. That is, when a logic level of the bits DD1 to DD3 constituting the duty-cycle control signal DD changes, the noise resulting from the parasitic capacitances between control lines for transmitting the respective bits DD1 to DD3 and the bias line VL are superimposed on the bias line VL. These parasitic capacitances mainly consist of parasitic capacitances Cgd between the gates and drains of the transistors 71 to 73. For example, when the bit DD1 changes from a low level to a high level, the parasitic capacitance Cgd included in the transistor 71 instantaneously increases the level of the bias line VL. Conversely, when the bit DD1 changes from a high level to a low level, the level of the bias line VL instantaneously drops. To design a compensation capacitance 81 to have a large capacitance can curtail such noise to some extent. However, this delays the change in the bias voltage Vbias in response to the change in the duty cycle signal DD.

The balance capacities 91 to 93 solve the above problems. That is, the inversion signals of the bits DD1 to DD3 are supplied to the balance capacities 91 to 93, respectively. Therefore, the noise superimposed on the bias line VL via the transistors 71 to 73 because of changes in the bits DD1 to DD3 is cancelled by noise superimposed on the bias line VL via the balance capacities 91 to 93 because of the changes in the bits DD1 to DD3. For example, when the bit DD1 changes from a low level to a high level, the noise via the transistor 71 is supposed to instantaneously increase the level of the bias line VL. At the same time, however, the noise via the balance capacitance 91 instantaneously drops the level of the bias line VL. As a consequence, no noise is generated in the bias voltage. In this way, the balance capacities 91 to 93 function as cancellation circuits that cancel a potential fluctuation in the bias line VL generated when the duty-cycle control signal DD changes.

Furthermore, the noise can be cancelled almost completely with designing the channel width Wc to be half of the channel width Wb as described above. The reason is as follows: The noise via the transistors 71 to 73 derives from the parasitic capacitances Cgd between the gates and drains of the transistors 71 to 73. On the other hand, the noise via the balance capacities 91 to 93 derives from both the parasitic capacitances between the gates and drains of the transistors 71 to 73 and parasitic capacitances between the gates and sources thereof. Therefore, if the channel widths are equally set to the transistors 71 to 73 and the balance capacities 91 to 93, the balance capacities 91 to 93 will have the capacitances twice as large as those of the transistors 71 to 73. But, in the present embodiment, the channel widths of the transistors constituting the respective balance capacities 91 to 93 are set half as large as the channel widths of the transistors 71 to 73. Therefore the noise can be completely cancelled. It should be noted that the above descriptions have been given on the premise that the channel widths of the respective transistors are constant. When the channel widths are considered to change, "gate areas" can replace the "channel widths".

Figure 6:
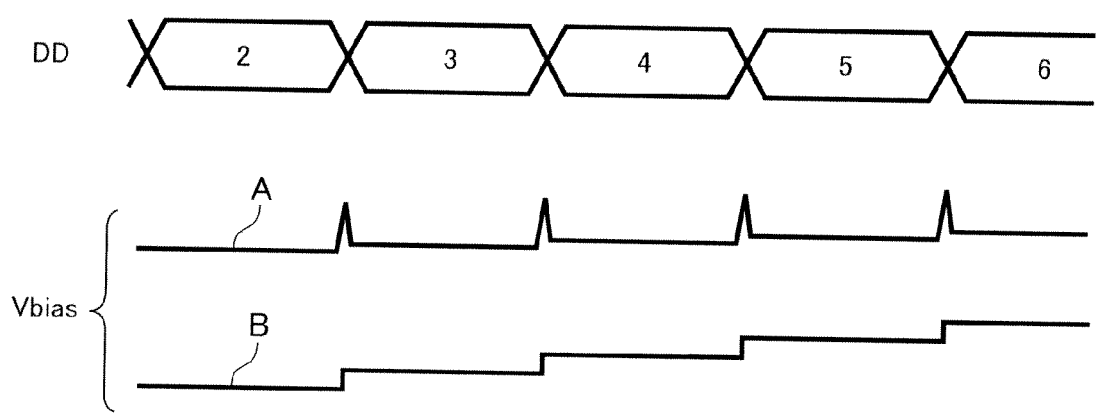
FIG. 6 is a waveform diagram for schematically explaining an operation of the bias circuit 26 shown in FIG. 5.

As indicated by a waveform A in FIG. 6 which represents a comparative example in which the bias circuit 26 does not employ the balance capacities 91 to 93, large noise is superimposed on the bias voltage Vbias before and after the changes in the duty-cycle control signal DD (2, 3, 4, 5, 6 and onwards). Particularly in the duty-cycle adjustment circuit 22 shown in FIG. 3, the bias line VL is directly connected to gates of the bias transistors 45 and 47. Therefore, the noise superimposed on the bias voltage Vbias directly influences the bias transistors 45 and 47. This possibly prevents the duty-cycle adjustment circuit 22 from adjusting the duty cycle of the internal clock signal LCLK to the desired value.

On the other hand, in the present embodiment, as indicated by a waveform B in FIG. 6, the level of the bias voltage Vbis normally changes when the duty-cycle control signal DD changes, and no noise is generated before and after the change. This makes the amount of the electric charge extracted by the bias transistors 45 and 47 equal to a desired amount. And thus it becomes possible for the duty-cycle adjustment circuit 22 to adjust the duty cycle of the internal clock signal LCLK to the desired value (typically, 50%). In this way, according to the present embodiment, the bias circuit 26 can cancel the noise on the bias line VL and it becomes possible for the duty-cycle adjustment circuit 22 to adjust the duty cycle to the desired value, despite the gates of the bias transistors 45 and 47 to be controlled are directly connected to the bias line VL, and for that reason, the noise superimposed on the bias line VL has a great effect on the duty cycle.

The embodiment of applying the present invention to the bias circuit 26 that controls the duty-cycle adjustment circuit 22 has been described above. However, the applicable range of the present invention is not limited thereto. For example, the present invention can be also applied to the delay line 21.

Figure 7:
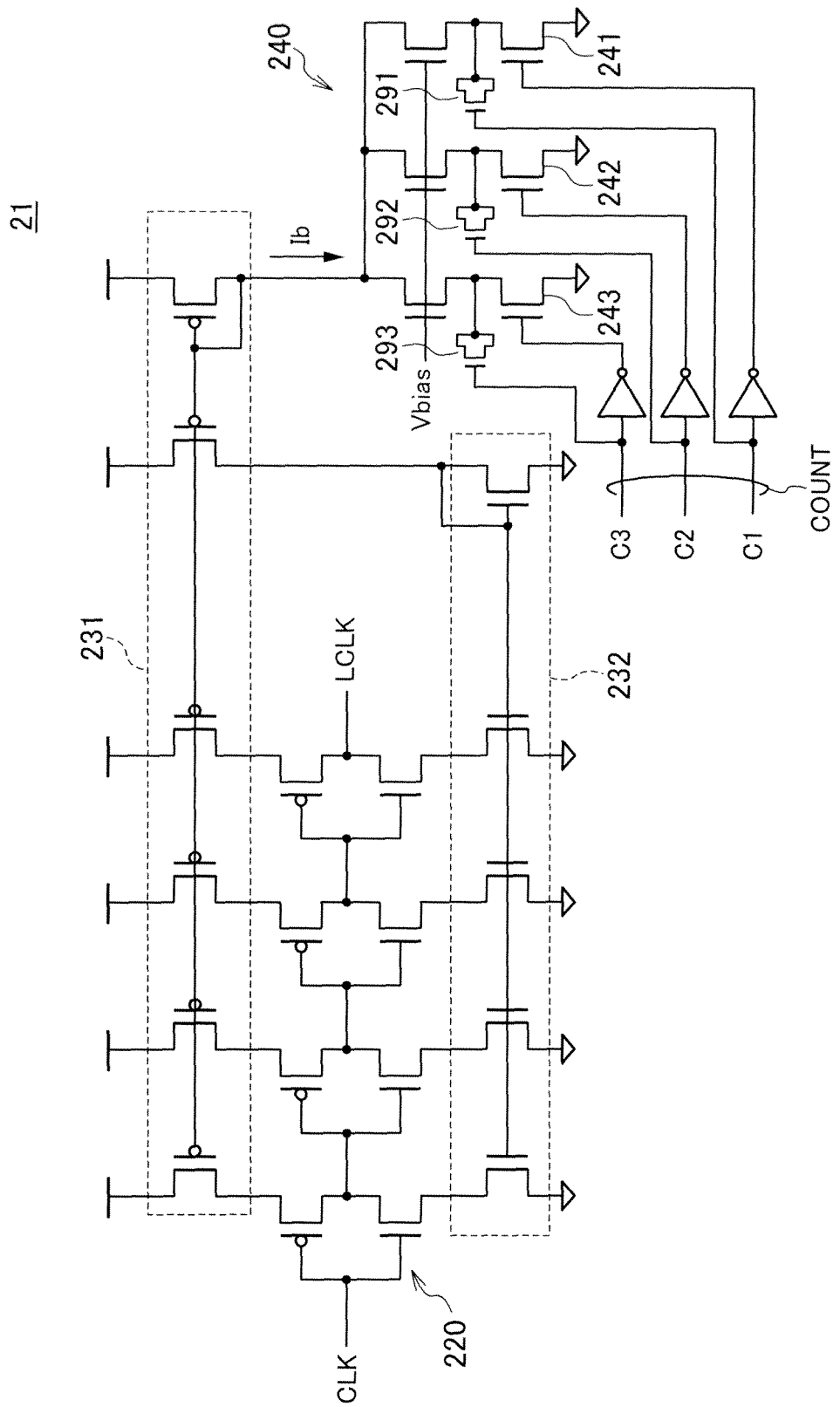
FIG. 7 is a circuit diagram of the delay line 21 shown in FIG. 2.

Turning to FIG. 7, the delay line 21 includes an inverter array 220 of a plurality of inverters (in this example, four stages), a constant current circuit 231 that applies an operating current to sources of P-channel MOS transistors constituting the inverter array 220, a constant current circuit 232 that applies an operating current to sources of N-channel MOS transistors constituting the inverter array 220, and a current adjustment circuit 240 that determines a current Ib of the constant current circuits 231 and 232.

The current adjustment circuit 240 includes three select transistors 241 to 243 connected in parallel. The select transistors 241 to 243 have weighted current supply capabilities. Assuming that the channel width of the select transistor 241 is Wd, the channel width of the select transistors 242 and 243 are designed to 2 Wd and 4 Wd, respectively. Furthermore, inversion signals of three bits C1 to C3 that constitute the count value COUNT of the counter circuit 24 are supplied to gates of the select transistors 241 to 243, respectively. The current adjustment circuit 240 thereby selects one of eight current values based on the three-bit count value COUNT.

The current Ib generated by the current adjustment circuit 240 based on the count value COUNT is copied by current mirror circuits included in the constant current circuits 231 and 232, and applied to the inverter array 220 as an operating current. The operating current changes transmission characteristics of the inverter array 220 that determine delay amounts. Therefore, the count value COUNT can control the phase of the internal clock signal LCLK.

Furthermore, in the present embodiment, balance capacities 291 to 293 are connected to drains of the select transistors 241 to 243, respectively, and the three bits C1 to C3 that constitute the count value COUNT are supplied to gates of transistors that constitute the respective balance capacities 291 to 293. Channel widths of the transistors that constitute the balance capacities 291 to 293 are preferably Wd/2, Wd, and 2 Wd, respectively for the same reason as that described above. By configuring the delay line 21 in this manner, the noise generated by the changes in the count value COUNT is cancelled by the balance capacities 291 to 293. Therefore, the phase of the internal clock signal LCLK can be accurately controlled.

It is apparent that the present invention is not limited to the above embodiments, but may be modified and changed without departing from the scope and spirit of the invention.

For example, in the above embodiment, both the duty-cycle control signal DD and the count value COUNT are three-bit signals. However, the numbers of bits of these signals are not limited to three.

Furthermore, in the above embodiment, MOS transistors each having a source short-circuited to a drain are used as the balance capacities. However, the use of such MOS transistors is not essential in the present invention. Further, even when the MOS transistors each having a source short-circuited to a drain are used as the balance capacities, inputting of signals gates of the MOS transistors and connection of sources and drains to the bias line are not essential in the present invention and vice versa.

What is claimed is:

1. A semiconductor device comprising:
a bias line to which a bias current flows;
a switch circuit controlling an amount of the bias current based on a control signal;
a control line to which the control signal is supplied;
a cancellation circuit substantially cancelling a fluctuation in voltage potential of the bias line caused by changing the control signal, the fluctuation in voltage potential propagating via a parasitic capacitance between the control line and the bias line;
a current-to-voltage conversion circuit converting the bias current into a bias voltage;
a bias transistor having a control electrode to which the bias voltage is supplied; and
a clock transmission line transmitting a clock signal,
wherein the cancellation circuit includes a balance capacitor having one end being coupled to the bias line and the other end to which an inversion signal of the control signal is supplied, and
wherein the bias transistor is coupled to the clock transmission line so that transmission characteristics of the clock transmission line is controlled based on the bias voltage.

2. The semiconductor device as claimed in claim 1, wherein the switch circuit comprises a first MOS (metal-oxide-semiconductor) transistor, and
the parasitic capacitance comprises a capacitance between a gate electrode and a drain of the first MOS transistor.

3. The semiconductor device as claimed in claim 2, wherein the balance capacitor comprises a second MOS transistor having source and drain short-circuited to each other.

4. The semiconductor device as claimed in claim 3, wherein a gate area of the second MOS transistor is substantially half as large as a gate area of the first MOS transistor.

5. The semiconductor device as claimed in claim 1, further comprising an inverter array transmitting a clock signal,
wherein the bias transistor is inserted between the inverter array and a power supply line so that transmission characteristics of the inverter array is controlled based on the bias voltage.

6. A semiconductor device comprising:
a bias line to which a bias current flows;
a switch circuit including a plurality of MOS transistors each having a gate electrode and a drain, each of the gate electrodes having a different width from each other, and the drains being commonly coupled to the bias line;
a control circuit supplying each of control signals to the gate electrode of an associated one of the MOS transistors; and
a plurality of balance capacitors each having a different capacitance from each other, and each having one end being commonly coupled to the bias line and the other end to which an inversion signal of an associated one of the control signals is supplied.

7. The semiconductor device as claimed in claim 6, wherein each of capacitances between the gate electrodes and the drains of the MOS transistors is substantially equal to a capacitance of one of the balance capacitors to which an inversion signal of the associated one of the control signals is supplied.

8. The semiconductor device as claimed in claim 1, wherein a control circuit controls the bias current for the bias line,
wherein the control circuit, the switch circuit, control line, and cancellation circuit being a first switch circuit, a first control line, and a first cancellation circuit of the control circuit, and
wherein the control circuit comprises a plurality of balance capacitors each having a different capacitance from each other, and each having one end being commonly coupled to the bias line and the other end to which an inversion signal of an associated one of the control signals is supplied.

9. The semiconductor device as claimed in claim 8, wherein the plurality of balance capacitors act as cancellers of noise which is generated in the bias line when the switch circuit changes state.

10. A semiconductor device comprising:
a bias line;
a first power supply line;
a first transistor being provided between the bias line and the first power supply line, the first transistor having a control terminal connected to a first signal line;
a first capacitor being provided for the first transistor, the first capacitor having one end being connected to the bias line and the other end being connected to the first signal line;
a first inverter being provided between the first signal line and either one of the control terminal of the first transistor and the other end of the first capacitor;
a second transistor being provided between the bias line and the first power supply line, the second transistor having a control terminal connected to a second signal line;
a second capacitor being provided for the second transistor, the second capacitor having one end being connected to the bias line and the other end being connected to the second signal line; and
a second inverter being provided between the second signal line and either one of the control terminal of the second transistor and the other end of the second capacitor.

11. The semiconductor device as claimed in claim 10, further comprising:
a third capacitor having one end being connected to the bias line and the other end being connected to a second power supply line.

12. The semiconductor device as claimed in claim 10, further comprising:
a third transistor being provided between the first transistor and the first power supply line, the third transistor having a control terminal being connected to a third signal line; and
a fourth transistor being provided between the second transistor and the first power supply line, the fourth transistor having a control terminal being connected to the third signal line.

13. The semiconductor device as claimed in claim 10, wherein the first capacitor is configured by a first MOS transistor, the one end of the first capacitor being configured by a control terminal of the first MOS transistor, the other end of the first capacitor being configured by a source and a drain of the first MOS transistor short-circuited one another, and the second capacitor is configured by a second MOS transistor, the one end of the second capacitor being configured by a control terminal of the second MOS transistor, the other end of the second capacitor being configured by a source and a drain of the second MOS transistor short-circuited one another.

14. The semiconductor device as claimed in claim 10, wherein
the first capacitor is configured by a first MOS transistor, the other end of the first capacitor being configured by a control terminal of the first MOS transistor, the one end of the first capacitor being configured by a source and a drain of the first MOS transistor short-circuited one another, and the second capacitor is configured by a second MOS transistor, the other end of the second capacitor being configured by a control terminal of the second MOS transistor, the one end of the second capacitor being configured by a source and a drain of the second MOS transistor short-circuited one another.

15. The semiconductor device as claimed in claim 10, further comprising:
a fifth transistor being a first conductive type, the fifth transistor having a control terminal being connected to the bias line, one of a source and a drain of the fifth transistor also being connected to the bias line; and a sixth transistor being the first conductive type, the sixth transistor also having a control terminal being connected to the bias line.

16. The semiconductor device as claimed in claim 10, further comprising:
an inverter array including a plurality of inverters, the inverters including a first inverter having an input terminal supplied with a signal, an input terminal of each of the inverters other than the first inverter is connected to the input terminal of the former one of the inverters; and a constant current circuit being connected to the control terminal of the sixth transistor and the control terminal of the seventh transistor, the constant current circuit supplying an operating current to each of the inverters constituting the inverter array.

17. The semiconductor device as claimed in claim 10, wherein the bias line is a line to which a bias current flows.

18. The semiconductor device as claimed in claim 10, wherein a channel width of the first transistor is different from a channel width of the second transistor.

19. The semiconductor device as claimed in claim 10, wherein
the one end of the first capacitor is connected to a drain of the first transistor, and the one end of the second capacitor is connected to a drain of the second transistor.

20. The semiconductor device as claimed in claim 12, wherein
the one end of the first capacitor is connected to a first node, the first node being a connecting point of the first transistor with the third transistor, and the one end of the second capacitor is connected to a second node, the second node being a connecting point of the second transistor with the fourth transistor.

* * * * *